United States Patent
Boettcher et al.

(10) Patent No.: US 7,453,945 B2
(45) Date of Patent: Nov. 18, 2008

(54) METHODS AND DEVICES FOR CONTROLLING RF, MULTI-CARRIER AMPLIFIER SIGNAL POWER

(75) Inventors: Charles W. Boettcher, Chester, NJ (US); Edward Ellis Eibling, Convent Station, NJ (US); Gregg Nardozza, Glenwood, NJ (US); Mathew Thomas, Madison, NJ (US); Matthijs A. Visser, Hoboken, NJ (US); Lily H. Zhu, Parsippany, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 951 days.

(21) Appl. No.: 10/654,977

(22) Filed: Sep. 5, 2003

(65) Prior Publication Data

US 2005/0054382 A1    Mar. 10, 2005

(51) Int. Cl.
*H04K 1/10* (2006.01)
*H04L 25/03* (2006.01)

(52) U.S. Cl. .................................... 375/260; 375/297

(58) Field of Classification Search ................ 375/297, 375/130, 260, 296; 455/522, 453; 370/311
See application file for complete search history.

(56) References Cited

U.S. PATENT DOCUMENTS

| | | | | |
|---|---|---|---|---|
| 5,621,855 | A * | 4/1997 | Veldhuis et al. | 704/229 |
| 6,487,415 | B1 * | 11/2002 | Eibling et al. | 455/453 |
| 6,526,102 | B1 * | 2/2003 | Piirainen | 375/297 |
| 6,609,007 | B1 * | 8/2003 | Eibling et al. | 455/522 |
| 6,810,027 | B1 * | 10/2004 | Posti | 370/311 |
| 7,027,482 | B1 * | 4/2006 | Nomura | 375/130 |
| 7,085,580 | B1 * | 8/2006 | Eibling et al. | 455/522 |

* cited by examiner

*Primary Examiner*—Don N Vo

(57) ABSTRACT

The input (and output) power of a multi-carrier amplifier can be controlled to allow the amplifier to operate at high RF power levels and still remain within a power rating profile. The amplifier (or amplifiers) power is controlled using an aggregate scaling factor. The aggregate scaling factor is generated from a plurality of amplifier scaling factors. Each amplifier scaling factor is generated based on a comparison of a time-averaged total power and a corresponding threshold.

20 Claims, 3 Drawing Sheets

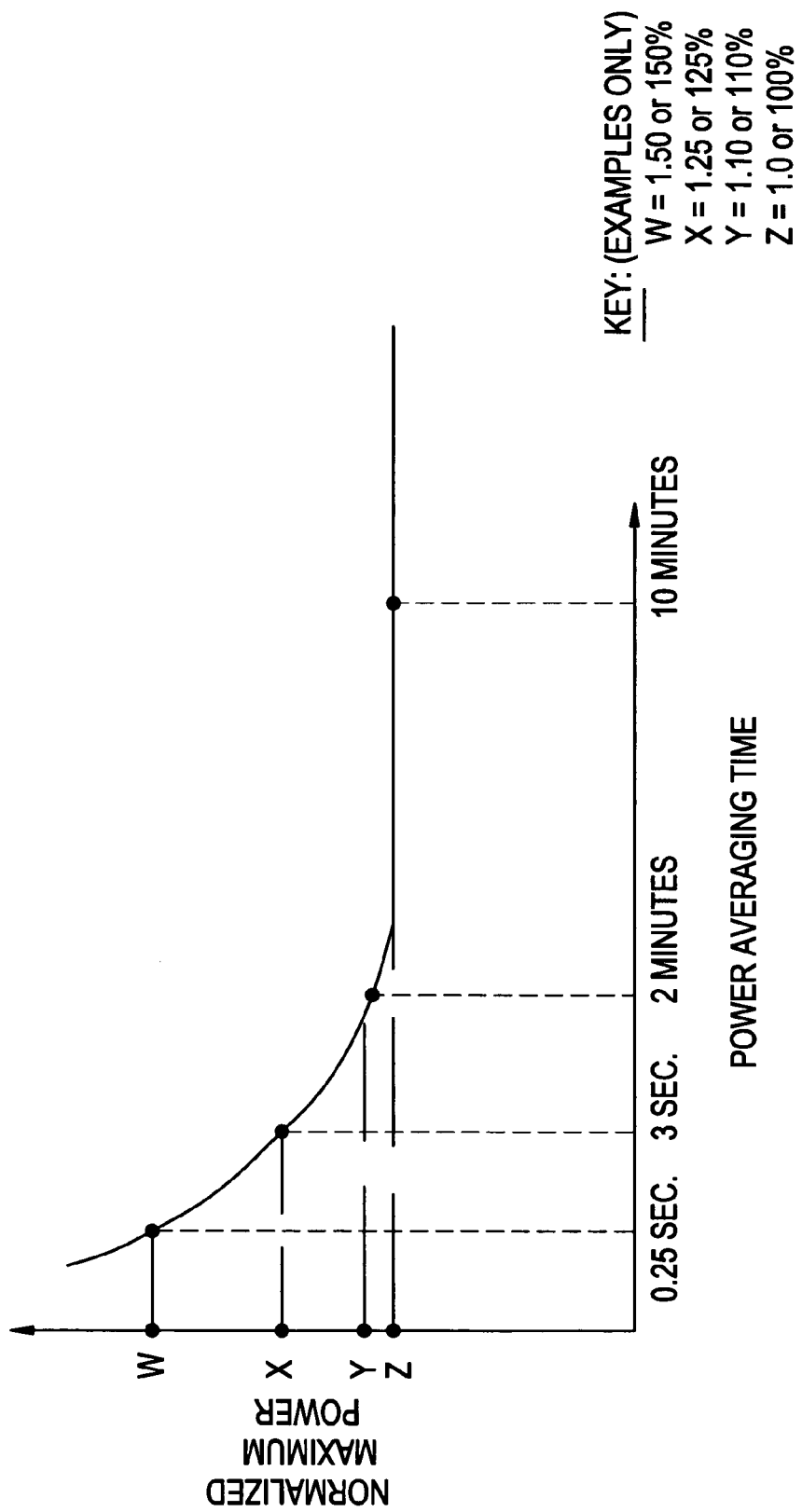

METHODS AND DEVICES FOR CONTROLLING RF, MULTI-CARRIER AMPLIFIER SIGNAL POWER

BACKGROUND OF THE INVENTION

One of the most important things that affects the cost of a wireless base station is the design of the final, high power radio frequency (RF) amplifier used in, or with, the base station. Such amplifiers are themselves expensive. In addition, though, the RF output power capabilities of a particular amplifier have an impact on frame size, battery backup designs/costs, utility costs, air conditioning costs, etc.

Given the fact that RF power requirements have a direct impact on amplifier design and cost, it is important to control the maximum RF power demanded of an amplifier rather than oversizing the amplifier to handle surges in RF transmit power demand. In existing techniques, the maximum RF transmit power is controlled in a feedback loop independently of so-called call admission controls. This, unfortunately, can lead to a degradation in quality of service.

Historically, RF amplifiers used in base stations are selected for a given application based on a "steady state average" power rating and a "peak" power rating. As is known by those skilled in the art, the peak power rating applies to very short periods of time, usually measured in microseconds, to accommodate high peak to average ratios of spread spectrum signals, like Code Division Multiple Access (CDMA) signals. In between the times associated with steady-state and peak power ratings, other ratings or requirements are specified to establish a profile for the amplifier (e.g., a graph of power limit versus averaging time). For example, one or more points on the profile might be based on the ability of an amplifier to meet a spurious emission mask requirement at a power level higher than the steady state rating, for an averaging time measured in seconds. Other points with longer averaging times might be based on thermal limitations. Taken together, all of these considerations are used to form a maximum power versus averaging-time, amplifier power rating profile (profile). Rather than use oversized amplifiers, it would be advantageous to develop control techniques which place constraints on maximum RF power loads, measured with multiple integration time constants, so that the dynamic, RF load is consistent with the amplifier's profile. Such techniques should regulate an amplifier's output, to ensure that it does not exceed its transient and steady state power ratings, but should also do so in conjunction with call admission controls in order to preserve quality of service.

SUMMARY OF THE INVENTION

The present invention provides for methods and devices which control the power levels of a multi-carrier amplifier according to an associated profile. Each profile may contain a plurality of averaging times which may be used to generate one or more amplifier scaling factors. The amplifier scaling factors may be generated from one or more power thresholds that may have been adjusted to account for the fact that some of the amplifier scaling factors tend to mask the effect of other scaling factors. An aggregate scaling factor is generated from the amplifier scaling factors. Thereafter, the aggregate scaling factor may be used to control (e.g., throttle) the power input into one or more amplifiers (and, therefore, also control each amplifiers output power).

BRIEF DESCRIPTION OF THE DRAWINGS

FIG. 3 depicts an averaging time-dependent, power rating profile for an amplifier used to illustrate features of the present invention.

DETAILED DESCRIPTION OF THE INVENTION

Figure 1:
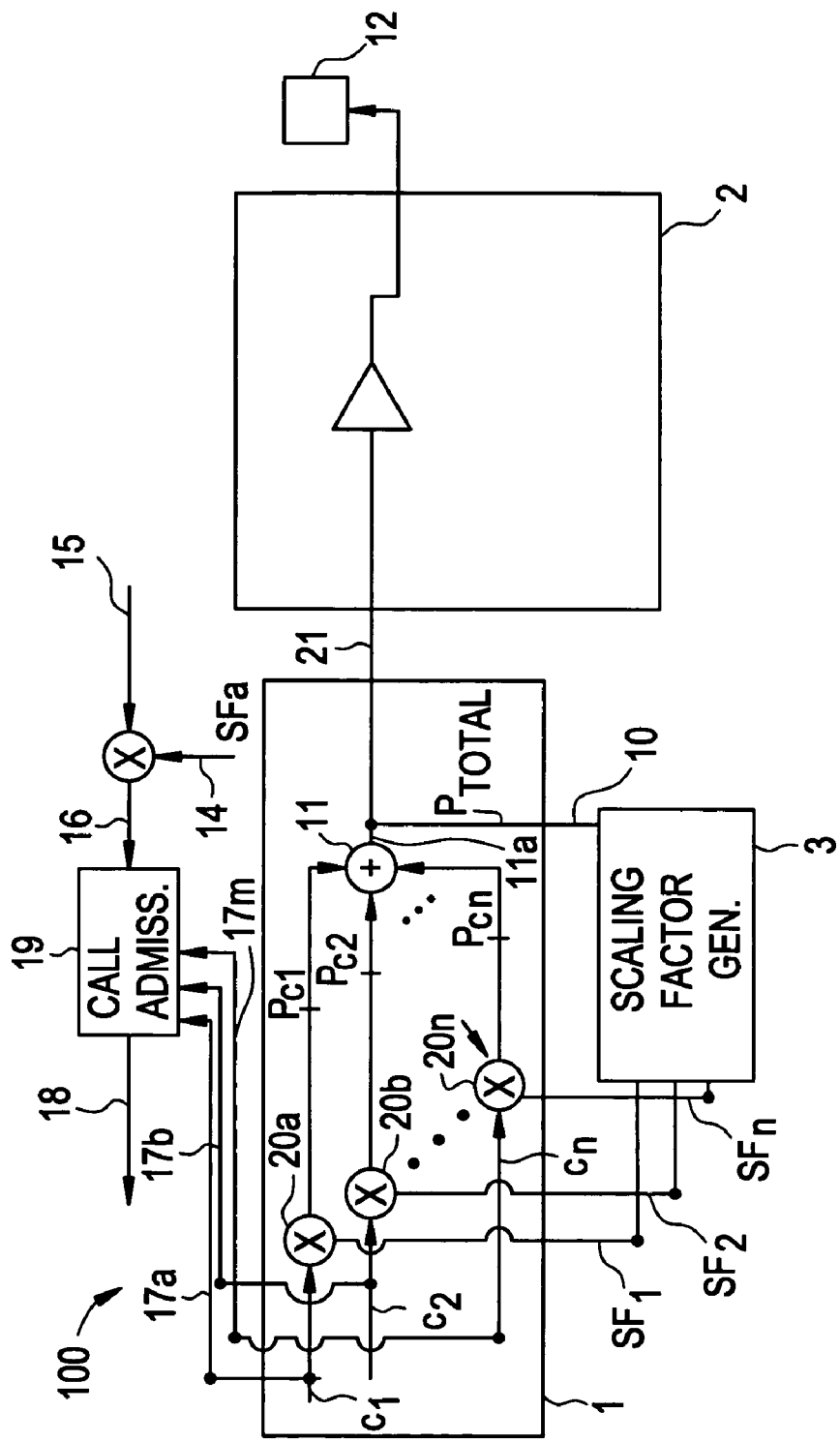
FIG. 1 depicts a block diagram of a wireless base station or the like which includes a scaling factor generator for controlling an amplifier power according to one embodiment of the present invention.

Referring now to FIG. 1, there are shown components of a wireless base station 100. As shown, the base station 100 comprises a radio control section 1, multi-carrier amplifier section 2 (hereafter referred to as "amplifier"), scaling factor generator 3, and call admission control section 19. Though shown as four separate sections, it should be understood that these components may be combined into less than four sections or further broken down into additional sections without departing from the spirit and scope of the present invention. In addition, one or more of these sections may or may not be co-located. For example, amplifier 2 and/or call admission control section 19 may be separately located from radio control section 1.

Generally speaking, the base station 100 operates as follows. Carrier signals $c_1, c_2, \ldots c_n$ (where n indicates a last carrier signal) containing information are generated by, or otherwise input into, radio control section 1 at independent power levels. Within radio control section 1, these various signals $c_1, c_2 \ldots c_n$ are then combined by combiner 11 into a signal 11a at a certain power level which may then pass through additional components and be modified by additional radio control section functions before being sent via pathway 21 to the amplifier 2. The amplifier 2, therefore, sees as its input power a power level originating from combiner 11. Before going further it should be understood that an amplifier assembly comprising one or more amplifiers may be substituted for amplifier 2 without departing from the spirit or scope of the present invention. For discussion purposes, a single amplifier 2 will be used.

The present invention provides techniques for controlling the magnitude of the combined carrier power signal 11a. Because this signal is eventually input into amplifier 2, controlling the input power has the net effect of also controlling the output power of amplifier 2 to ensure it operates within its associated power rating profile. Once amplified by amplifier 2, the carrier signals are transmitted using one or more antennas (wireless applications) or cables (wired applications) 12 or the like.

In one embodiment of the present invention, the amplifier input power is controlled by scaling factor generator 3 in combination with multipliers $20a, 20b, \ldots 20n$. Scaling factor generator 3 is operable to generate one or more carrier signal scaling factors $SF_1, SF_2 \ldots SF_n$ which are sent to multipliers $20a, 20b, \ldots 20n$. These scaling factors are then used by multipliers $20a, 20b, \ldots 20n$ to adjust or set the power levels of carrier signals $c_1, c_2 \ldots c_n$. In FIG. 1, these carrier signal powers are denoted $Pc_1, Pc_2, \ldots Pc_n$. Controlling the carrier signal powers makes it possible to control the amplifier input power because the latter is generated from the former.

Before continuing, it should be understood that the information placed on carrier signals $c_1, c_2, \ldots c_n$ may be formatted according to any number of formats or protocols. For example, CDMA, Universal Mobile Telecommunication Systems (UMTS), Global Systems for Mobile communications (GSM), High Data Rate (HDR), and Time-Division, Multiple Access (TDMA) formats, to name a few.

Figure 2:
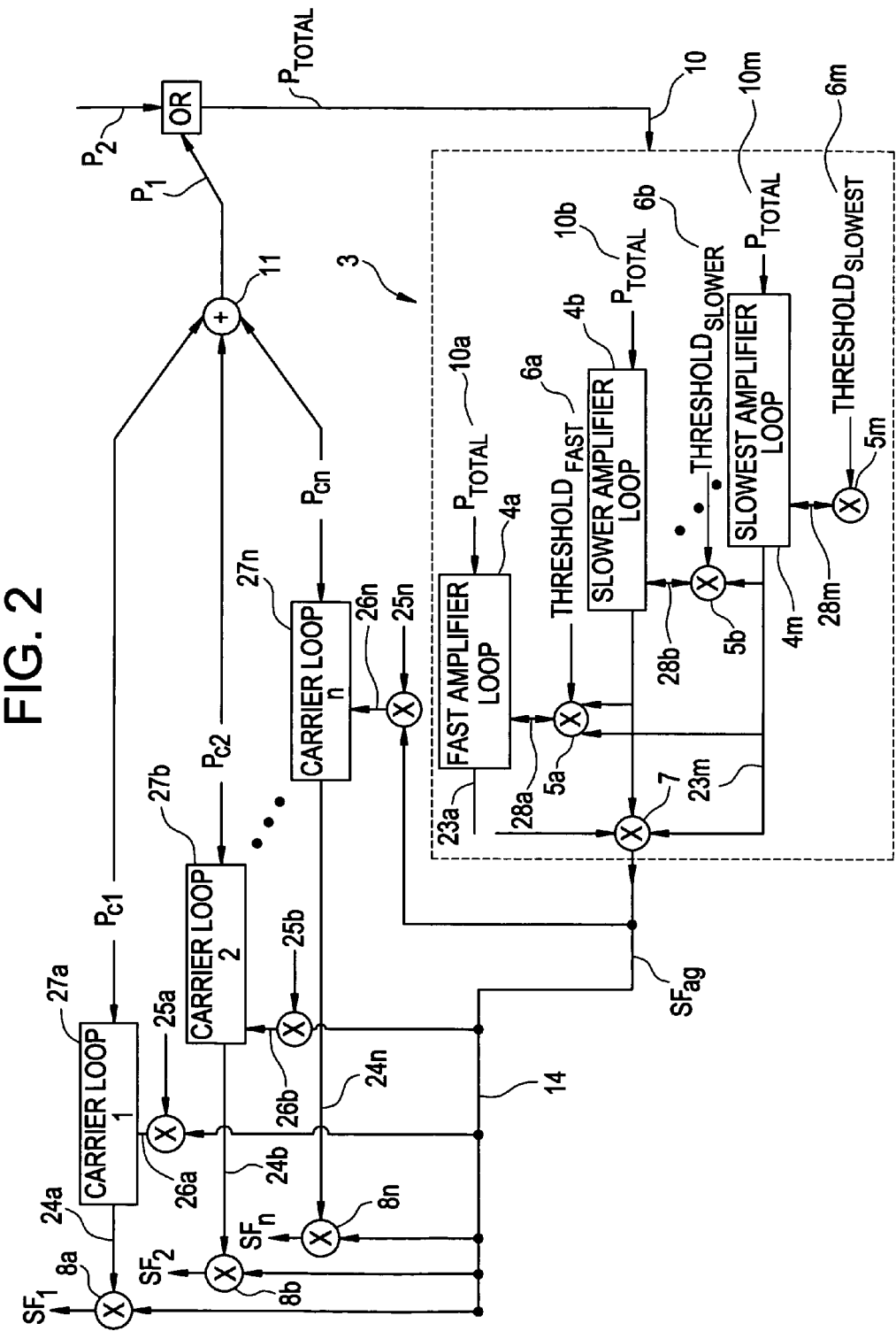
FIG. 2 depicts a block diagram of a scaling factor generator for controlling an amplifier power according to another embodiment of the present invention.

Referring now to FIG. 2, the scaling factor generator 3 is shown in more detail. Generator 3 is shown comprising control loops, 4a, 4b, ... 4m (where "m" represents the last loop). In one embodiment of the present invention, each control loop 4a, 4b, ... 4m is operable to receive a different time-averaged representation of the total power $P_{total}$ as $P_{total-10a}$, $P_{total-10b}$, ... $P_{total-10m}$. The total power $P_{total}$ may represent the combined power of all carriers, $P_1$, or the combined power of less than all of the carriers, $P_2$ (e.g., some communication protocols, like HDR carriers cannot tolerate this type of control). In such a case, total power $P_2$ would be used, which excludes power from non-tolerant carriers. Otherwise, total power $P_1$ would be used.

Upon receiving a time-averaged representation of the total power $P_{total-10a}$, $P_{total-10b}$, ... $P_{total-10m}$, each of the loops 4a, 4b, ... 4m are operable to generate amplifier scaling factors 23a, 23b, ... 23m. These scaling factors are multiplied together in multiplier 7 which outputs an aggregate scaling factor $SF_{ag}$. This aggregate scaling factor $SF_{ag}$ is sent via pathway 14 to multipliers 8a, 8b, ... 8n. Multipliers 8a, 8b, ... 8n are operable to generate and output individual carrier signal scaling factors $SF_1$, $SF_2$, ... $SF_n$ using the aggregate scaling factor $SF_{ag}$ and intermediate carrier scaling factors 24a, 24b, ... 24n.

Briefly summarizing the discussion up to now, it can be said that the amplifier scaling factors 23a, 23b, ... 23m generated by loops 4a, 4b, ... 4m ultimately control the amplifier input power because these scaling factors are used to generate an aggregate scaling factor which in turn is used to generate carrier signal scaling factors which ultimately are used to set the carrier signal power levels $P_{c1}$, $P_{c2}$, ... $P_{cn}$ used by combiner 11 to generate an amplifier input power level.

Returning to the operation of loops 4a, 4b, ... 4m, each loop 4a-4m is operable to generate and update its respective scaling factor at a rate equal to at least three times faster than the reciprocal of a known time constant.

Referring to FIG. 3, there is shown an illustrative averaging time-dependent power rating profile of an amplifier, like amplifier 2. On the x axis there are shown points at selected averaging times corresponding to 0.25 seconds, 3 seconds, 2 minutes, and 10 minutes, respectively. On the y axis are maximum power ratings normalized to steady-state rated powers. Points w, x, y, and z are the power ratings that apply for the selected averaging times.

In one embodiment of the invention, loops 4a, 4b, ... 4m are operable to generate amplifier scaling factors 23a, 23b, ... 23m which in turn control the maximum input and output power of amplifier 2 to ensure it is constrained according to a curve similar to the curve illustrated in FIG. 3. Said another way, loops 4a, 4b, ... 4m are operable to generate amplifier scaling factors 23a, 23b, ... 23m which act to constrain the maximum output power to levels similar to levels (e.g., 125%, 110%, 100%) shown in FIG. 3 that correspond to the 3 second, 2 minute, and 10 minute averaging times.

It should be understood that if other averaging times are used, the net result is that different scaling factors 23a, 23b, ... 23m will be generated by loops 4a, 4b, ... 4m in order to generate the appropriate power levels associated with these new averaging times. In addition, though three loops are shown in FIG. 2, any number of loops (e.g., one or more) may be used to generate an aggregate scaling factor. Though not necessary for an understanding of the present invention, the different and much-shorter averaging times used to integrate $P_{total}$ to obtain $P_{total-10a}$, $P_{total-10b}$, ... $P_{total-10m}$ may be set (and adjusted) using filters (not shown in FIG. 2) placed on the input of loops 4a, 4b, ... 4m. Because each loop 4a, 4b, ... 4m is connected to a different filter, each loop is fed a different filtered version of $P_{total}$. That is, $P_{total-10a}$, $P_{total-10b}$, ... $P_{total-10m}$ are not identical.

When used hereafter, the terms "fast" loop, "slow" loop, etc., refer to the averaging time constant selected. More specifically, these refer to integration time periods used by loops 4a, 4b, ... 4m to generate amplifier scaling factors 23a, 23b, ... 23m.

As indicated above, one of the inputs to each of the loops 4a, 4b, ... 4m is a $P_{total-10a}$, $P_{total-10b}$, ... $P_{total-10m}$ derived originally from either power $P_1$ or $P_2$. It should be noted that power $P_1$ is not, strictly speaking, identical to total power 21 shown in FIG. 1 though each is shown originating from combiner 11. It should be noted that total power 11 may undergo additional signal conditioning before being applied to amplifier 2, as 21.

In one embodiment, $P_1$ (or $P_2$) and the scaling factors $SF_1$, $SF_2$ ... $SF_n$ generated by section 3 are digital signals. In an additional embodiment of the present invention, $P_1$ (or $P_2$) may be an analog signal and the scaling factors generated by section 3 may also be analog signals.

In addition to having $P_{total-10a}$, $P_{total-10b}$, ... $P_{total-10m}$ as an input, each of the loops 4a-4m has, as an additional input, a threshold power 6a, 6b, ... 6m. In one embodiment of the present invention, each of the loops 4a-4m compares a total power to its respective threshold power. In further embodiments of the present invention, a short-term-average power threshold may be used by loop 4a, a mid-term-average power threshold may be used by loop 4b while a long-term-average power threshold may be used by loop 4m. If the total power is less than the threshold power, then a loop is operable to output a reference value, e.g., an integer value equal to 1, as an amplifier scaling factor.

If, however, $P_{total-10a}$, $P_{total-10b}$, ... $P_{total-10m}$ is greater than a threshold value, a loop is operable to generate a scaling factor which equals a value (e.g., a fraction) less than the reference value.

Generally, the loops act as follows. After some time interval, each of the loops 4a-4m is operable to compare its threshold power to a total power. Once a loop 4a-4m determines that its filtered representation of $P_{total}$ has exceeded its adjusted threshold, 28a, 28b, ... 28m, the loop begins to output a fractional scaling factor 23a, 23b, ... 23m. Each loop continually updates its scaling factor to constrain the average power measured with its associated averaging time to its corresponding maximum power (threshold) on a power rating profile such as the one shown in FIG. 3.

In this manner, the fractional scaling factors are used to eventually control the amplifier 2, allowing it to run at transient power levels which exceed its rated long-term-average power yet still conform to an associated profile.

It can be said then that the aggregate scaling factor, $SF_{ag}$ is not only generated from all of the amplifier scaling factors, $SF_1$, $SF_2$, ... $SF_n$ but is also generated by selecting a plurality of averaging times and associated power thresholds selected from a power rating profile because the averaging times and power thresholds are used to generate the amplifier scaling factors.

In multiple constraint, multi-loop systems such as the system shown in FIG. 2, it is important that the actions of each loop be independent. That is, it is important that interactions between loops be avoided or minimized. During experimentation, the inventors realized that the effect of some of the loops would be dampened or masked by others. For example, the fast, 3-second loop 4a would override the effects of the slower loops 4b and 4m. To prevent this from happening, the present inventors decided to use the scaling factors generated by the slower loops as a way to control the dampening effect of the faster loops. More specifically, in further embodiments of the present invention, the scaling factors generated by the slower loops are used to adjust the power thresholds 6a, 6b, . . . 6 (m−1) used by the faster loops. This decouples the loops and makes their control actions independent of each other. For example, instead of receiving short-term-average power threshold 6a, the first loop 4a receives an adjusted threshold 28a which is the result of multiplying the short-term-average power threshold 6a by the product of the mid-term-average power amplifier scaling factor 23b through the long-term-average power amplifier scaling factor 23m. The net result is this. Loop 4a uses the adjusted threshold 28a, not the original short-term power threshold 6a, as a comparison against a $P_{total}$, 10a, 10b, . . . 10m. Similarly, the next loop 4b uses an adjusted mid-term threshold 28b equal to a product of the mid-term power threshold 6b and long-term power amplifier scaling factor 23m in carrying out its comparison. Because the last loop 4m operates the slowest, it is not necessary for it to use a threshold which is adjusted by any one of the thresholds generated by the faster loops 4a, 4b, . . . 4(m−1). In sum, one or more power thresholds are adjusted using amplifier scaling factors from one or more slower amplifier loops to reduce the effect of faster loops.

In actuality, $P_{total-10a}$, $P_{total-10b}$, . . . $P_{total-10m}$, the short-term, mid-term, and long-term average power thresholds, and the mid-term and long-term average power amplifier scaling factors are only some of the factors which are used by the loops to generate scaling factors, 23a, 23b, . . . 23m. In further embodiments of the present invention, each of the scaling factors 23a, 23b, . . . 23m is generated using the following equations:

For the first scaling factor 23a:

$$\text{pwr-scale\_3sec}[j] = \min\{1, \text{pwr\_scale\_3sec}[j-1] * ((1 - 1/\text{n\_win\_3sec}) + (1/\text{n\_win\_3sec}) * \text{pwr\_threshold\_3sec} * \text{pwr\_scale\_2min} * \text{pwr\_scale\_10min} / \text{total\_pwr\_20ms}[j])\} \quad (1)$$

For the next scaling factor 23b:

$$\text{pwr-scale\_2min}[j] = \min\{1, \text{pwr\_scale\_2min}[j-1] * ((1 - 1/\text{n\_win\_2min}) + (1/\text{n\_win\_2min}) * \text{pwr\_threshold\_2min} * \text{pwr\_scale\_10min} * \text{pwr\_scale\_10min} / \text{total\_pwr\_1sec}[j])\} \quad (2)$$

For the last scaling factor 23m:

$$\text{pwr-scale\_10min}[j] = \min\{1, \text{pwr\_scale\_10min}[j-1] * ((1 - 1/\text{n\_win\_10min}) + (1/\text{n\_win\_10min}) * \text{pwr\_threshold\_10min} / \text{total\_pwr\_5sec}[j])\} \quad (3)$$

For the aggregate scaling factor 14:

$$\text{SF}_{ag}[j] = \text{pwr-scale\_3sec}[j] \times \text{pwr-scale\_2min}[j] \times \text{pwr-scale\_10min}[j] \quad (4)$$

where,
"total_pwr_20 ms[j]", "total_pwr_1 sec[j]", and "total_pwr_5 sec[j]" is the sum of the controlled individual carrier powers, $P_{total}$, averaged over 20 msec, 1 sec, and 5 sec, respectively and corresponding to 10a, 10b, and 10m of FIG. 2);

"pwr_scale_3 sec[j]", "pwr_scale_2 min[j]", and "pwr_scale_10 min[j]" are the amplifier scaling factors applied to constrain the input amplifier assembly power averaged over three seconds, two minutes, and ten minutes, respectively.

"pwr_scale_3 sec[j−1]", "pwr_scale_2 min[j−1]", and "pwr_scale_10 min[j−1]" are the values of these scaling factors at the preceding iteration.—"n_win_3 sec", "n_win_2 min", and "n_win_10 min" are the Infinite Impulse Response (IIR) filtering time constants expressed by the number of 20 msec, 1 sec, and 5 sec intervals, respectively;

"pwr_threshold_3 sec", "pwr_threshold_2 min", and "pwr_threshold_10 min", specify the thresholds 6a, 6b, 6c used to constrain the input amplifier power averaged over three seconds, two minutes, and ten minutes, respectively; and;

"$SF_{ag}[j]$" is the aggregate scaling factor from loops 23a, 23b, 23c.

In sum, the first loop 4a is operable to generate its scaling factor 23a using Equation (1), the next loop 4b is operable to generate its scaling factor 23b using Equation (2), while the last loop 4m is operable to generate its scaling factor 23m using Equation (3).

As indicated above briefly, some communication formats demand that their power levels not be adjusted. In a further embodiment of the present invention, if one of the carriers $c_1$, $c_2$, . . . $c_n$ comprises an HDR carrier signal, the radio control section 1 is operable to generate an HDR carrier signal power without applying a scaling factor generated by the scaling factor generator 3. Thereafter, the radio control section 1 is operable to generate an amplifier input power based on the unscaled HDR carrier signal power and one or more scaled carrier signal powers (in the case where the other carriers are not HDR carriers).

Before discussing the call admission control section 19, some mention should be made of how intermediate carrier scaling factors 24a, 24b, . . . 24n are generated. Similar to the generation of scaling factors 23a-23m, each scaling factor 24a, 24b, . . . 24n is generated from a comparison of the individual carrier powers, $P_{c1}$, $P_{c2}$, . . . $P_{cn}$ to a threshold. As shown in FIG. 2, each carrier loop 27a, 27b, . . . 27n is operable to compare a carrier power $P_{c1}$, $P_{c2}$, . . . $P_{cn}$ to an adjusted power threshold 26a, 26b, . . . 26n, respectively. The adjusted thresholds are derived from intermediate carrier thresholds 25a, 25b, . . . 25n that have been adjusted using the aggregate scaling factor $SF_{ag}$ 14. Thus, each loop uses an adjusted version of threshold to complete its comparison against a carrier power level. If a comparison indicates that a carrier power is less than the adjusted threshold, then a reference carrier scaling factor (e.g., 1) is output as an intermediate scaling factor 24a, 24b, . . . 24n. If a comparison indicates that a carrier power $P_{c1}$, $P_{c2}$, . . . $P_{cn}$ is greater than an adjusted threshold then a value less than the reference (e.g., a fraction) is output as an intermediate scaling factor $24a, 24b, \ldots 24n$.

It should be noted that the scaling factors could also be used to control call admission decisions associated with each carrier $c_1, c_2, \ldots c_n$. In a further embodiment of the present invention, the base station 100 may comprise a call admission control section 19. Call admission control section 19 may be operable to deny the admission of new calls into base station 100 which would be transmitted via a given carrier $c_1, c_2, \ldots c_n$. Call admission control section 19 receives pre-scaled carrier powers, for example, $c_1$ input via pathway 17a shown in FIG. 1. In addition, call admission control section 19 receives an adjusted carrier admission power threshold 16 which is generated by multiplying a carrier admission power threshold 15 by the aggregate scaling factor, $SF_{ag}$. Upon receiving these inputs, the call admission control section 19 is operable to compare the adjusted, carrier admission power threshold 16 to a pre-scaled carrier signal power $c_1$. Thereafter, the call admission control section 19 is operable to admit or deny calls into base station 100 based on the results of this comparison. For example, if the pre-scaled carrier power is above the adjusted threshold, calls may be denied admission.

In sum, the scaling factors generated by each of the loops $23a, 23b, \ldots 23m$ may be used to control the amplifier input and output power levels and the admission or denial of calls on a per carrier basis.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Consequently, the method, system or device or portions thereof may be implemented in different locations, such as the wireless unit, the base station, a base station controller and/or mobile switching center. Moreover, processing circuitry required to implement and use the described system or device may be implemented in application specific integrated circuits, software-driven processing circuitry, firmware, programmable logic devices, hardware, discrete components or arrangements of the above components as would be understood by one of ordinary skill in the art with the benefit of this disclosure. Those skilled in the art will readily recognize that these and various other modifications, arrangements and methods can be made to the present invention without strictly following the exemplary applications illustrated and described herein and without departing from the spirit and scope of the present invention. It is therefore contemplated that the appended claims will cover any such modifications or embodiments as fall within the true scope of the invention.

We claim:

1. A method for controlling a multi-carrier amplifier comprising:
   generating a plurality of amplifier scaling factors from a plurality of received signals;
   generating an aggregate scaling factor based on the amplifier scaling factors,
   wherein the aggregate scaling factor is used to control a multi-carrier, amplifier power level.

2. The method as in claim 1 comprising:
   adjusting one or more power thresholds using the amplifier scaling factors from one or more slower amplifier loops to reduce the effect of faster loops.

3. The method as in claim 2 wherein the power thresholds are selected from the group consisting of a short-term power threshold, mid-term power threshold and long-term power threshold.

4. The method as in claim 1 comprising:
   generating one or more carrier signal scaling factors from the aggregate scaling factor and one or more intermediate carrier scaling factors.

5. The method as in claim 4 comprising:
   generating one or more carrier signal powers using the one or more carrier signal scaling factors; and
   generating an amplifier input power from the one or more carrier signal powers.

6. The method as in claim 5 comprising:
   generating one or more HDR carrier signal powers without applying a scaling factor; and
   generating an amplifier input power from the unscaled HDR carrier signal powers and one or more scaled carrier signal powers.

7. The method as in claim 1 comprising wirelessly transmitting an amplified, multi-carrier signal.

8. The method as in claim 7 wherein the multi-carrier signal comprises signals selected from a group consisting of Code Division Multiple Access (CDMA), Universal Mobile Telecommunication Systems (UMTS), Global Systems for Mobile communications (GSM), High Data Rate (HDR), and Time-Division, Multiple Access (TDMA) signals.

9. The method as in claim 1 wherein the generation of the amplifier scaling factors is based on averaging times of 3 seconds, 2 minutes and 10 minutes selected from a power rating profile.

10. The method as in claim 1 comprising:
    adjusting at least one carrier signal power threshold by the aggregate scaling factor;
    comparing the adjusted carrier signal power threshold to at least one associated pre-scaled carrier signal power; and
    admitting or denying a call based on results of the comparison.

11. A device for controlling a power level of a multi-carrier amplifier comprising:
    a scaling factor generator operable to;
    generate a plurality of amplifier scaling factors from a plurality of received signals;
    generate an aggregate scaling factor based on the amplifier scaling factors,
    wherein the aggregate scaling factor is used to control a multi-carrier, amplifier power level.

12. The device as in claim 11 wherein the generator is further operable to:
    adjust one or more power thresholds using the amplifier scaling factors from one or more slower amplifier loops to reduce the effect of faster loops.

13. The device as in claim 12 wherein the power thresholds are selected from the group consisting of a short-term power threshold, mid-term power threshold and long-term power threshold.

14. The device as in claim 11 comprising a radio control section operable to:
    generate one or more carrier signal scaling factors from the aggregate scaling factor and one or more intermediate carrier scaling factors.

15. The device as in claim 14 wherein the radio control section is further operable to:
    generate one or more carrier signal powers using the one or more carrier signal scaling factors; and
    generate an amplifier input power from the one or more carrier signal powers.

16. The device as in claim 14 wherein the radio control section is further operable to:
  generate one or more HDR carrier signal powers without applying a scaling factor; and
  generate an amplifier input power from the unscaled HDR carrier signal powers and one or more scaled carrier signal powers.

17. The device as in claim 11 further comprising one or more amplifiers operable to wirelessly transmit an amplified, multi-carrier signal.

18. The device as in claim 17 wherein the multi-carrier signal comprises signals selected from a group consisting of CDMA, UMTS, GSM, HDR and TDMA signals.

19. The device as in claim 11 wherein the generation of the amplifier scaling factors is based on averaging times of 3 seconds, 2 minutes and 10 minutes selected from a power rating profile.

20. The device as in claim 11 comprising a call admission control section operable to:
  adjust at least one carrier signal power threshold by the aggregate scaling factor;
  compare the adjusted carrier signal power threshold to at least one associated pre-scaled carrier signal power; and
  admit or deny a call based on results of the comparison.

* * * * *